United States Patent
Ha et al.

(10) Patent No.: US 8,901,016 B2
(45) Date of Patent: Dec. 2, 2014

(54) METHOD OF FORMING METAL OXIDE HARDMASK

(75) Inventors: Jeongseok Ha, Tama (JP); Hideaki Fukuda, Hachioji (JP); Shintaro Kaido, Machida (JP)

(73) Assignee: ASM Japan K.K., Tokyo (JP)

( * ) Notice: Subject to any disclaimer, the term of this patent is extended or adjusted under 35 U.S.C. 154(b) by 278 days.

(21) Appl. No.: 13/333,420

(22) Filed: Dec. 21, 2011

(65) Prior Publication Data

US 2012/0164846 A1 Jun. 28, 2012

Related U.S. Application Data

(60) Provisional application No. 61/427,661, filed on Dec. 28, 2010.

(51) Int. Cl.
*H01L 21/228* (2006.01)
*H01L 21/02* (2006.01)
*H01L 21/033* (2006.01)

(52) U.S. Cl.
CPC .... *H01L 21/02153* (2013.01); *H01L 21/02186* (2013.01); *H01L 21/02274* (2013.01); *H01L 21/0228* (2013.01); *H01L 21/0337* (2013.01)
USPC ................ 438/785; 257/E21.271; 438/788; 438/702

(58) Field of Classification Search
CPC ................ H01L 21/02153; H01L 21/02186; H01L 21/0337; H01L 21/02274
USPC ........................ 438/778, 785, 77–774, 788; 257/E21.271
See application file for complete search history.

(56) References Cited

U.S. PATENT DOCUMENTS

| | | | | |
|---|---|---|---|---|
| 7,498,242 B2* | 3/2009 | Kumar et al. | | 438/474 |
| 7,611,980 B2* | 11/2009 | Wells et al. | | 438/597 |
| 7,727,864 B2* | 6/2010 | Elers | | 438/485 |
| 7,732,343 B2* | 6/2010 | Niroomand et al. | | 438/725 |
| 7,807,578 B2* | 10/2010 | Bencher et al. | | 438/703 |
| 7,824,492 B2 | 11/2010 | Tois et al. | | |
| 7,902,582 B2* | 3/2011 | Forbes et al. | | 257/306 |
| 7,910,288 B2* | 3/2011 | Abatchev et al. | | 430/313 |
| 8,470,187 B2* | 6/2013 | Ha | | 216/37 |
| 2003/0157436 A1* | 8/2003 | Manger et al. | | 430/311 |
| 2008/0305443 A1* | 12/2008 | Nakamura | | 430/325 |
| 2009/0146322 A1* | 6/2009 | Weling et al. | | 257/786 |
| 2010/0195392 A1* | 8/2010 | Freeman | | 365/185.08 |
| 2011/0006402 A1* | 1/2011 | Zhou | | 257/618 |
| 2011/0086516 A1* | 4/2011 | Lee et al. | | 438/792 |
| 2011/0117490 A1* | 5/2011 | Bae et al. | | 430/270.1 |
| 2011/0124196 A1* | 5/2011 | Lee | | 438/696 |
| 2011/0183269 A1* | 7/2011 | Zhu | | 430/319 |
| 2011/0294075 A1* | 12/2011 | Chen et al. | | 430/323 |
| 2012/0164837 A1* | 6/2012 | Tan et al. | | 438/703 |
| 2012/0264305 A1* | 10/2012 | Nakano | | 438/694 |

FOREIGN PATENT DOCUMENTS

JP 2009099938 5/2009

* cited by examiner

*Primary Examiner* — Savitr Mulpuri
(74) *Attorney, Agent, or Firm* — Snell & Wilmer L.L.P.

(57) ABSTRACT

A method of forming a metal oxide hardmask on a template includes: providing a template constituted by a photoresist or amorphous carbon formed on a substrate; and depositing by atomic layer deposition (ALD) a metal oxide hardmask on the template constituted by a material having a formula $Si_xM_{(1-x)}O_y$ wherein M represents at least one metal element, x is less than one including zero, and y is approximately two or a stoichiometrically-determined number.

15 Claims, 9 Drawing Sheets

METHOD OF FORMING METAL OXIDE HARDMASK

CROSS-REFERENCE TO RELATED APPLICATIONS

This application claims the benefit of U.S. Provisional Application No. 61/427,661, filed Dec. 28, 2010 under 35 USC 119(e), the disclosure of which is herein incorporated by reference in its entirety.

BACKGROUND

The present invention relates to semiconductor integrated circuit manufacturing and, more particularly to a method of forming a hardmask, particularly a spacer film.

DESCRIPTION OF THE RELATED ART

Photolithography technology has recently faced difficulty of forming patterns having pitches smaller than the submicron level. Various approaches have been studied, and one of the promising methods is space-defined double patterning (SDDP) which makes it possible to create narrow pitches beyond limitations of conventional lithography such as light source wavelength and high index immersion fluid. Generally, SDDP needs one conformal spacer film and hardmask template wherein the conformal spacer film is deposited on the template normally having convex patterns. A silicon oxide layer is commonly used as a conformal spacer, and a hardmask template is typically constituted by photoresist (PR) or amorphous carbon (a-C) prepared by a spin-on or CVD process.

As discussed blow, the present inventors have recognized several problems in SDDP and developed solutions thereto, which solutions can also be applicable to general patterning processes. Thus, the present invention relates to improvement on general patterning processes using a hardmask, and particularly on SDDP.

Any discussion of problems and solutions involved in the related art has been included in this disclosure solely for the purposes of providing a context for the present invention, and it should not be taken as an admission that any or all of the discussion were known at the time the invention was made.

In SDDP process flow, it is required for a spacer film to be etch-selective relative to a base film which is typically a bottom antireflective coating (BARC) or a hardmask having BARC functions. The base film is typically constituted by a material such as SiO, SiOC, TiN-HM, etc. which is typically formed by CVD. Typically, as a spacer film, a low-temperature SiO film (LT-SiO) which is formed by atomic layer deposition (ALD) at low temperatures is used. However, the LT-SiO does not have sufficient etch (dry and/or wet) selectivity relative to a base film, thereby causing unexpected critical dimension (CD) changes or the like.

Most metal oxides/nitrides are known to be etch-selective to SiO. Some metal oxides are hardly etched by dry etch. That is a significant concern for semiconductor integration and also reactor cleaning. For example, $Al_2O_3$ is one of the promising candidate materials, because it has a 100% conformal film profile even at room temperature and has high etch selectivity relative to a base film. However, $Al_2O_3$ is known to be hardly etched by dry etch and/or wet etch, prohibiting $Al_2O_3$ from being used as a spacer material.

Further, it is required that a spacer film be formed at low deposition temperatures such as less than 150° C. when the template is constituted by photoresist, or less than 300° C. when the template is constituted by amorphous carbon. Otherwise, the template may be damaged by heat during the deposition of the spacer film, and additionally, if the temperature is as high as 400° C., diffusion or migration of Cu or B into a device such as an insulation film, wiring, or transistor may occur. Namely, the spacer film needs to be compatible with the template. Also, it is required for the spacer film to be substantially 100% conformal and have substantially no pattern loading effect (e.g., substantially the same thickness on sidewalls even when the density of patterns or pitch of patterns is different). Conventional spacer films do not satisfy the above criteria. Additionally, a metal such as V or Nb which is not commonly used in the semiconductor processing processes may not be a good candidate.

Many groups have studied conformal SiN deposition, but their attempts have not yet been successful to provide a solution to obtaining conformal SiN film. At a low temperature such as 400° C. or lower, a SiN process fails to form a conformal film ("conformal" refers to a Ts/Tt>about 95% wherein Ts and Tt are thicknesses on a sidewall and top surface, respectively), and the low-temperature SiN process is performed at an extremely low-growth rate such as less than 0.1 nm/min.

The present inventors have recognized still another problem in SDDP which is a problem of patterned spacer collapsing. FIG. 1 is a schematic representation illustrating a part of the SDDP sequence of (a) photoresist (PR) patterning, (b) SiO deposition by PE-ALD, (c) reactive ion etch (RIE), and (d) PR ashing. This figure is solely for addressing the above problem and does not necessarily represent conventional technology. As shown in FIG. 1, in step (a), PR 2 (template) is formed in a pattern on a base film 1 (BARC or hardmask), under which a target film 4 to be etched is formed. In step (b), a spacer film 3 is deposited on and covers PR 2 and the base film 1. In step (c), anisotropic spacer etching is conducted, and as a result, the top of PR 2 and the base film 1 are exposed, thereby forming an exposed PR 2' and a spacer 3'. In step (d), the exposed PR 2' is removed by etching, and as a result, the spacer 3' collapses, deteriorating the pattern.

The main cause of collapse appears to be capillary force during the process of drying residual rinse and water after the template (PR 2') is removed by ashing. The pattern collapse problem becomes more serious when patterns are as narrow as the submicron level and have higher aspect ratios such as one or higher. FIG. 2 is a schematic representation illustrating capillary force generated during the drying process. Capillary force $\sigma_{max}$ (maximum stress exerted on the spacer) is expressed by the following equation (Y. Matsui et al., ISSM 2010, Tokyo, PO-O-103):

$$\sigma_{max} = \frac{6\gamma\cos\theta}{D}\left(\frac{H}{W}\right)^2$$

γ: surface tension of $H_2O$
θ: $H_2O$ contact angle
D: space width
H: height
W: width In the figure, a spacer 21 is formed on a base film 23, and a space 22 between the spacers 21 is filled with water. The top of filled water is concave as it is being dried. The maximum stress exerted on the spacer 21 strongly depends on the aspect ratio (H/W) and the contact angle (θ).

One approach to solve this problem is using a hydrophobic material so as to reduce capillary force. However, it is very difficult to maintain hydrophobicity of the surface of the spacer for SDDP because even if the hydrophobic material is used, after ashing (typically by exposing the template to an oxidant plasma such as an oxygen plasma, $N_2O$ plasma, and $CO_2$ plasma, the surface is easily changed to hydrophilic because hydrophilic O—H is easily generated on the oxidized surface after air exposure.

SUMMARY

As discussed above, the present inventors have recognized several problems in SDDP and developed solutions thereto. The solutions can also be applicable to general patterning processes. Some embodiments of the present invention provide solutions to at least one of the above problems, and some embodiments provide solutions to all of the above problems.

An embodiment of the present invention provides a method of forming a metal oxide hardmask on a template, comprising: (i) providing a template constituted by a photoresist or amorphous carbon formed on a substrate; and (ii) depositing by atomic layer deposition (ALD) a metal oxide hardmask on the template constituted by a material having a formula $Si_x M_{(1-x)} O_y$, wherein M represents at least one metal element, x is less than one including zero, and y is approximately two or a stoichiometrically-determined number. The "hardmask" refers to a material used in any semiconductor processing as an etch mask in lieu of polymer or other organic "soft" materials (target films) which tend to be etched easily by oxygen, fluorine, chlorine, or other reactive gases to the extent that a pattern defined using the "soft" mask can be rapidly degraded during plasma etching as compared with the hardmask.

In some embodiment, the metal oxide hardmask is a spacer film. In some embodiments, the spacer film is for spacer-defined double patterning (SDDP), and the method further comprises performing SDDP after the step of depositing the spacer film on the template.

In some embodiments, M is a metal whose fluoride has a vapor pressure of more than 100 Pa at a temperature for cleaning a reactor used for depositing the metal oxide hardmask. In some embodiments, M is Ti, W, or Ta. In some embodiments, M is Ti. In some embodiments, the material constituting the metal oxide hardmask is $TiO_2$.

In some embodiments, the ALD is plasma enhanced ALD (PE-ALD). In some embodiments, the ALD is performed at a temperature of 300° C. or lower for the template constituted by the amorphous carbon or at a temperature of 150° C. or lower for the template constituted by the photoresist. In some embodiments, the ALD is performed under conditions substantially equivalent to those set for a $SiO_2$ hardmask constituted by $SiO_2$, wherein a gas containing M is used in place of a gas containing Si for the $SiO_2$ hardmask. In some embodiments, the metal oxide hardmask has an elastic modulus at least three times higher than that of the $SiO_2$ hardmask, and a hardness at least two times higher than that of the $SiO_2$ hardmask. In some embodiments, the metal oxide hardmask has a dry etch rate lower than that of the $SiO_2$ hardmask and a wet etch rate comparable to that of standard thermal oxide.

In some embodiments, the substrate has a base film formed under the template, which base film is constituted by silicon oxide. In some embodiments, the template has a convex pattern constituted by the photoresist or amorphous carbon, said convex pattern having a width of less than one micron meter and a ratio of height to width of one or higher.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are oversimplified for illustrative purpose and are not necessarily to scale.

DETAILED DESCRIPTION

Figure 1:
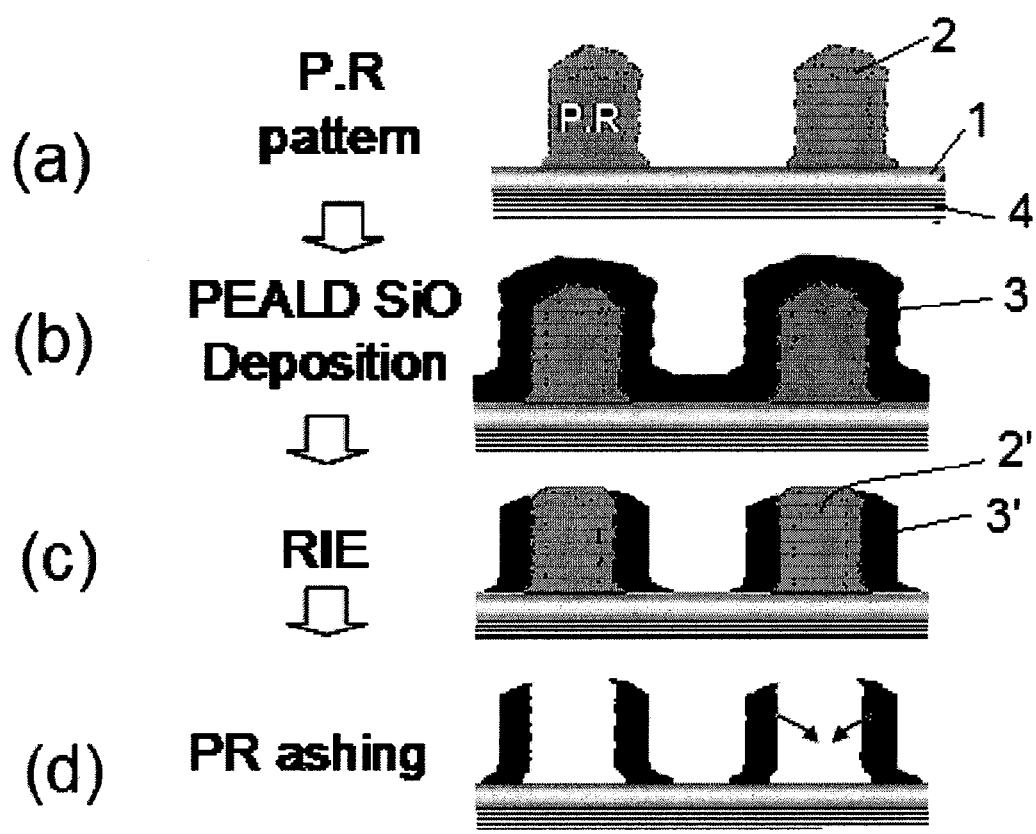
FIG. 1 is a schematic representation illustrating a part of the SDDP sequence of (a) photoresist (PR) patterning, (b) SiO deposition by PE-ALD, (c) reactive ion etch (RIE), and (d) PR ashing.
Figure 2:
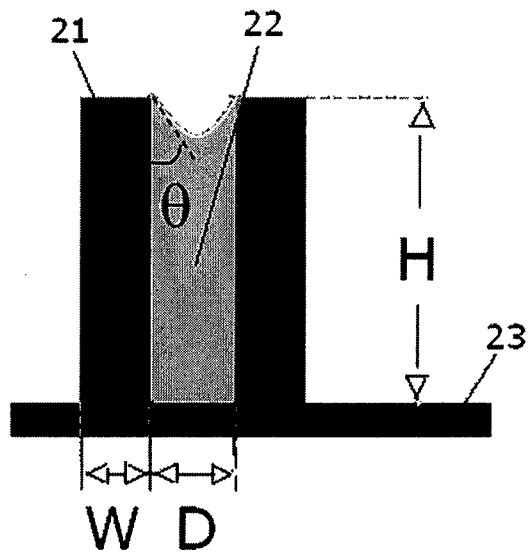
FIG. 2 is a schematic representation illustrating capillary force generated during the drying process.

In this disclosure, "gas" may include vaporized solid and/or liquid and may be constituted by a mixture of gases. In this disclosure, the reactant gas, the additive/carrier gas, and the precursor may be different from each other or mutually exclusive in terms of gas types, i.e., there is no overlap of gases among these categories. In some embodiments, "film" refers to a layer continuously extending in a direction perpendicular to a thickness direction substantially without pinholes to cover an entire target or concerned surface, or simply a layer covering a target or concerned surface. In some embodiments, "layer" refers to a structure having a certain thickness formed on a surface or a synonym of film. Further, "a" refers to a species or a genus including multiple species. In this disclosure, any defined meanings do not necessarily exclude ordinary and customary meanings in some embodiments. In the disclosure, "substantially higher", "substantially different", etc. refer to a difference of at least 10%, 50%, 100%, 200%, 300%, or any ranges thereof, for example. Also, in the disclosure, "substantially the same", "substantially equivalent", "substantially uniform", etc. refer to a difference of less than 20%, less than 10%, less than 5%, less than 1%, or any ranges thereof, for example. The numerical numbers applied in examples may be modified by a range of at least ±50% in other conditions, and further, in this disclosure, any ranges indicated may include or exclude the endpoints. In the present disclosure where conditions and/or structures are not specified, the skilled artisan in the art can readily provide such conditions and/or structures, in view of the present disclosure, as a matter of routine experimentation.

In some embodiments, in order to solve at least one or all of the problems discussed above in patterning processes using a hardmask, a hardmask material is selected. In some embodiments, a hardmask material is selected from candidate materials using at least one or all of the following criteria, for example: a material has high mechanical strength, and has a low dry and/or wet etch rate, but it can be etched by fluorine gas, and its fluoride is not solid at a reactor-cleaning temperature, and further, it can be deposited by ALD at low temperatures such as 400° C. or lower.

In some embodiments, hardmask materials can be selected using at least one or all of the following criteria:

1) A hardmask material has a higher mechanical strength than that of a conventional SiO hardmask. For example, the hardmask formed by ALD constituted by the material has an elastic modulus which is substantially higher than that of a conventional SiO hardmask formed by ALD at a low temperature, e.g., 150° C., and which is at least substantially equivalent to that of a conventional SiN hardmask formed by ALD at a low temperature, e.g., 150° C. Also, the hardmask formed by ALD constituted by the material has a hardness which is substantially higher than that of a conventional SiO hardmask formed by ALD at a low temperature, e.g., 150° C., and which is comparable to that of a conventional SiN hardmask formed by ALD at a low temperature, e.g., 150° C.

2) The hardmask material having a higher chemical resistance (low dry etch rate) than a conventional SiO hardmask. For example, the hardmask formed by ALD constituted by the material has a dry etch rate ($NF_3$ at 100° C.) which is substantially lower than that of a conventional SiO hardmask formed by ALD at a low temperature, e.g., 150° C., and which is also lower than that of standard thermal oxide. Also, the hardmask formed by ALD constituted by the material has a wet etch rate (DHF at 1:100) which is substantially lower than that of a conventional SiO hardmask formed by ALD at a low temperature, e.g., 150° C., and which is substantially comparable to that of standard thermal oxide.

3) The hardmask material contains at least one type of metal element, and oxygen and/or nitrogen. The material may be expressed by a formula $Si_xM_{(1-x)}O_y$, wherein M represents at least one metal element, x is less than one including zero, and y is approximately two or a stoichiometrically-determined number. For example, titanium oxide (e.g., $TiO_2$) and titanium silicon oxide (e.g., $TiSiO_4$), are included.

4) The hardmask material is constituted by a metal oxide (e.g., $TiO_2$) and a silicon oxide (e.g., $SiO_2$, non-metal silicon oxide) so as to effectively adjust a refractive index and a growth rate. In order to mix a metal oxide and a silicon oxide, the following methods can be performed in some embodiments: depositing thin films of the metal oxide and thin films of the silicon oxide alternately (each film having a thickness of about 3 nm or higher); depositing a film by introducing a mixture of precursors for the metal oxide and the silicon oxide; or depositing a film by alternately introducing a precursor for the metal oxide and a precursor of the silicon oxide. For example, a hardmask (metal silicon oxide, e.g., $Ti_xSi_{(1-x)}O_4$, $0<x\leq1$) can be formed by alternately depositing a metal oxide film and a silicon oxide film by ALD at a certain cycle ratio (a ratio of cycles for the metal oxide film to cycles for the silicon oxide film), wherein the growth rate of the silicon oxide is about 2.5 times higher than that of the metal oxide, and the refractive index of the silicon oxide is lower than that of the metal oxide, so that by adjusting the cycle ratio, the growth rate and the refractive index of the resultant hardmask can be adjusted. For example, when the cycle ratio is one (i.e., one cycle for the metal oxide film and one cycle for the silicon oxide film are alternately performed), the composition ratio of metal oxide to silicon oxide in the hardmask is about 1/2.5 since the growth rate of the silicon oxide is about 2.5 times higher than that of the metal oxide. By adjusting the cycle ratio, the proportion of metal oxide relative to the mixture of metal oxide and silicon oxide can vary from over 0% up to 100%.

5) The hardmask material contains at least one metal element, Si, and oxygen and/or nitrogen to tune optimal mechanical strength and dry etch rate. In some embodiments, this type of film can be formed by the methods disclosed in U.S. Pat. No. 7,824,492, the disclosure of which is herein incorporated by reference.

6) The hardmask can be formed by process steps including the steps described below by using the same reactor as that for forming a target film, a base film, and a template. This series of steps can be performed continuously. In the above, "continuously" refers to without breaking a vacuum, without interruption as a timeline, without moving the substrate, or immediately thereafter, as a next step. Although the hardmask can be deposited by ALD whereas the target film and base film can be deposited by CVD, these reactions can be accomplished in the same reactor.

6-1) Step of evaporating water from a template by baking: The template is subjected to heat which is subsequently generated by exposing the template to an inactive gas (e.g., He, Ar, or $N_2$) plasma or radicals, so as to evaporate water adsorbed on a surface of the template in a clean room outside the reactor, wherein the amount of adsorbed water depends on how long the template is exposed to air in the clean room.

6-2) Step of trimming and/or footing reduction using an oxygen-containing gas (e.g., $N_2O$ or $CO_2$).

6-3) Step of depositing an adhesion layer on a base film or treating a surface of the base film by a plasma in order to enhance adhesion between the hardmask (spacer) and the base film.

6-4) Step of depositing a spacer film by ALD (which is described later).

6-5) Step of post treatment: The spacer film can be treated by post treatment such as thermal annealing, plasma treatment, UV irradiation, radical exposure by using remote plasma, in order to prevent moisture adsorption.

7) The hardmask is formed by ALD. The deposition methods include plasma (both remote and in-situ) generation to activate reactant to cause deposition. A dry/wet etch rate and mechanical strength can be controlled by using multiple materials for the hardmask at a certain ratio, forming a composite film. The preparation of the composite film can be performed by at least one of the following: a) alternating a step of supplying one precursor and a step of supplying a different precursor to form one film on top of another and repeating the steps; b) depositing a film by supplying a mixed precursor containing multiple precursors; and c) depositing a film by separately supplying multiple discrete precursors simultaneously. The deposition temperature may be less than 300° C. when the template is constituted by amorphous carbon, or less than 150° C. when the template is constituted by photoresist.

8) The hardmask contains a metal whose fluoride is not solid at a reactor-cleaning temperature, e.g., less than 400° C., so that an unwanted film deposited on an inner wall of the reactor can easily be removed by a fluorine-containing cleaning gas.

Some embodiments will be explained below, but the embodiments are not intended to limit the present invention.

The metal oxide hardmask is constituted by an oxide of Ti, W, and/or Ta. In some embodiments, an oxide of Mn, Hf, and/or Ru can be used in place of or in combination with Ti, W, and/or Ta. However, preferably, titanium oxide, tungsten oxide, and/or tantalum oxide in view of material compatibility with semiconductor processing. The hardmask is deposited by ALD, preferably PE-ALD. For example, a precursor for titanium oxide can be at least one compound selected from titanium alkoxide and alkylamino titanium, including $Ti(OR)_4$ wherein R is independently CxHy (x=0, 1, 2, 3, 4, or 5, y=2x+1), and each R can be different (e.g., $Ti(OCH_3)_2(OC_2H_5)(OC_3H_7)$); $Ti(NR_2)_4$ wherein R is independently CxHy (x=0, 1, 2, 3, 4, or 5, y=2x+1), and each R can be different (e.g., $Ti(N(CH_3)(C_2H_5))_4$). A precursor for a metal oxide other than titanium oxide can also be selected from any suitable compounds. In general, an alkylamino precursor such as tetrakis-dimethylaminotitanium (TDMAT) can provide a higher film growth rate than does an alkoxy precursor such as titanium tetraisopropoxide (TTIP) because a precursor having a smaller molecular size such as TDMAT tends to have less steric hindrance so as to have more adsorption sites as compared with a precursor having a greater molecular size such as TTIP. Since ALD is a self-limiting adsorption reaction process, the amount of deposited precursor molecules is determined by the number of reactive surface sites and is independent of the precursor exposure after saturation, and a supply of the precursor is such that the reactive surface sites are saturated thereby by each pulse. The deposition temperature may be in a range of about 0 to about 200° C., which temperature is compatible with photoresist (e.g., does not cause thermal damage to photoresist). A reactant gas may be selected from the group consisting of $O_2$, $NH_3$, $N_2O$, and/or $H_2$. More than one reactant gas can be used for forming a metal oxide hardmask. A reactant gas flow rate may be in a range of about 100 to about 5,000 sccm. A carrier gas for the precursor may be in a range of about 200 to about 5,000 sccm. A deposition pressure may be in a range of about 100 to about 1,000 Pa. RF power may be in a range of about 50 to about 500 W for direct plasma, or more than 1 kW for remote plasma. A precursor bottle (or tank) temperature and delivery line may be controlled at a temperature of about 0 to about 200° C. In some embodiments, reaction energy can be supplied not only by means of plasma ignition, but also by means of UV irradiation.

Additionally, certain treatment can be performed before or during the deposition process, wherein treatment gas may be selected from the group consisting of $O_2$, $NH_3$, $H_2$, $N_2$, $N_2O$, He, and/or Ar.

The reactor temperature can be set differently (e.g., higher than that set for deposition) for reactor cleaning in order to increase cleaning speed.

Figure 4:
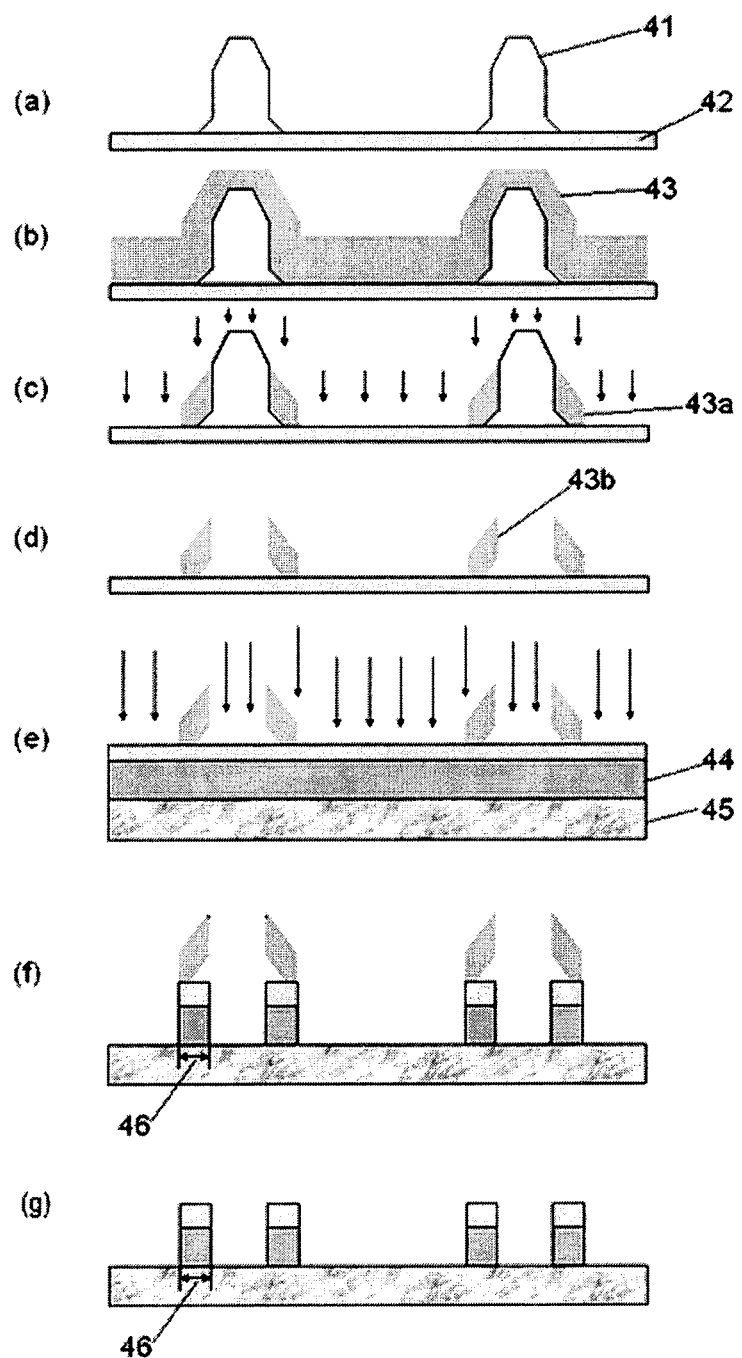
FIG. 4 schematically illustrates SDDP processes wherein (a) is a schematic cross sectional view of pre-patterned features formed on a hardmask, (b) is a schematic cross sectional view of conformal spacer deposition, (c) is a schematic cross sectional view of anisotropic spacer etching, (d) is a schematic cross sectional view of removal of the pre-patterned features, (e) is a schematic cross sectional view of pattern transfer by anisotropic etching, (f) is a schematic cross sectional view of transferred pattern profile, and (g) is a schematic cross sectional view of removal of the spacer.

In some embodiments, SDDP can be performed as follows:

FIG. 4 schematically illustrates SDDP processes. First, pre-patterned features 41 (e.g., photoresist) are formed on a base film (hardmask or BARC) 42 as shown in FIG. 4(a). Next, an integrated spacer film 43 (which is also referred to generally as "hardmask") which is a conformal film is deposited according to any of the disclosed embodiments to cover the pre-patterned features 41 and the base film 42 as shown in FIG. 4(b). The integrated film spacer has a desired ratio of thickness at the top to thickness at the bottom. A spacer will be a film layer formed on a sidewall of the pre-patterned feature 41. In order to form a spacer, anisotropic spacer etching is conducted as shown in FIG. 4(c) to remove all the film material on the bottom surface and the top surface including the slanted surfaces, i.e., all the horizontal surfaces and slanted surfaces at the top, leaving only the material on the sidewalls (43a). Because the thickness of the film at the slanted surfaces and the thickness of the film at the bottom surface are such that portions of the film at the slanted surface and at the bottom surface are removed by etching nearly at the same time, after removing the original pre-patterned features 41, complete removal of the residual portion at the top is realized, and only the spacer is left on the base film 42 as shown in FIG. 4(d). The inner wall 43b of the spacer does not have an overhang portion at the top edge. Using the spacer 43a, anisotropic etching is performed for pattern transfer as shown in FIG. 4(e), wherein a pattern transfer layer 44 is formed on a substrate 45. Because according to some embodiments, the spacer has sufficient etch selectivity relative to the base film, and no overhang portion is formed, the distance between the top edges of the spacer and the distance between the vertical portions of the spacer are substantially or nearly the same (±20% or less, ±10% or less, or ±5% or less), and the pattern transfer layer (target film) 44 is accurately etched in the vertical direction. According to some embodiments of the preset invention, the spacer 43b is less likely to collapse than a conventional spacer during a drying process after rinsing. That is, complete removal of the residual portion is achieved, and critical dimension (CD) variation can be minimized and a precise width 46 can be obtained as shown in FIG. 4(f). Further, according to some embodiments, the spacer can easily be removed by etching as shown in FIG. 4(g). Further, when the metal contained in the spacer is subjected to fluoridation when the reactor is cleaned with a fluorine-containing gas, the metal fluoride is not solid at a reactor-cleaning temperature, and thus, it can easily be removed from an inner wall of the reactor.

Figure 6:
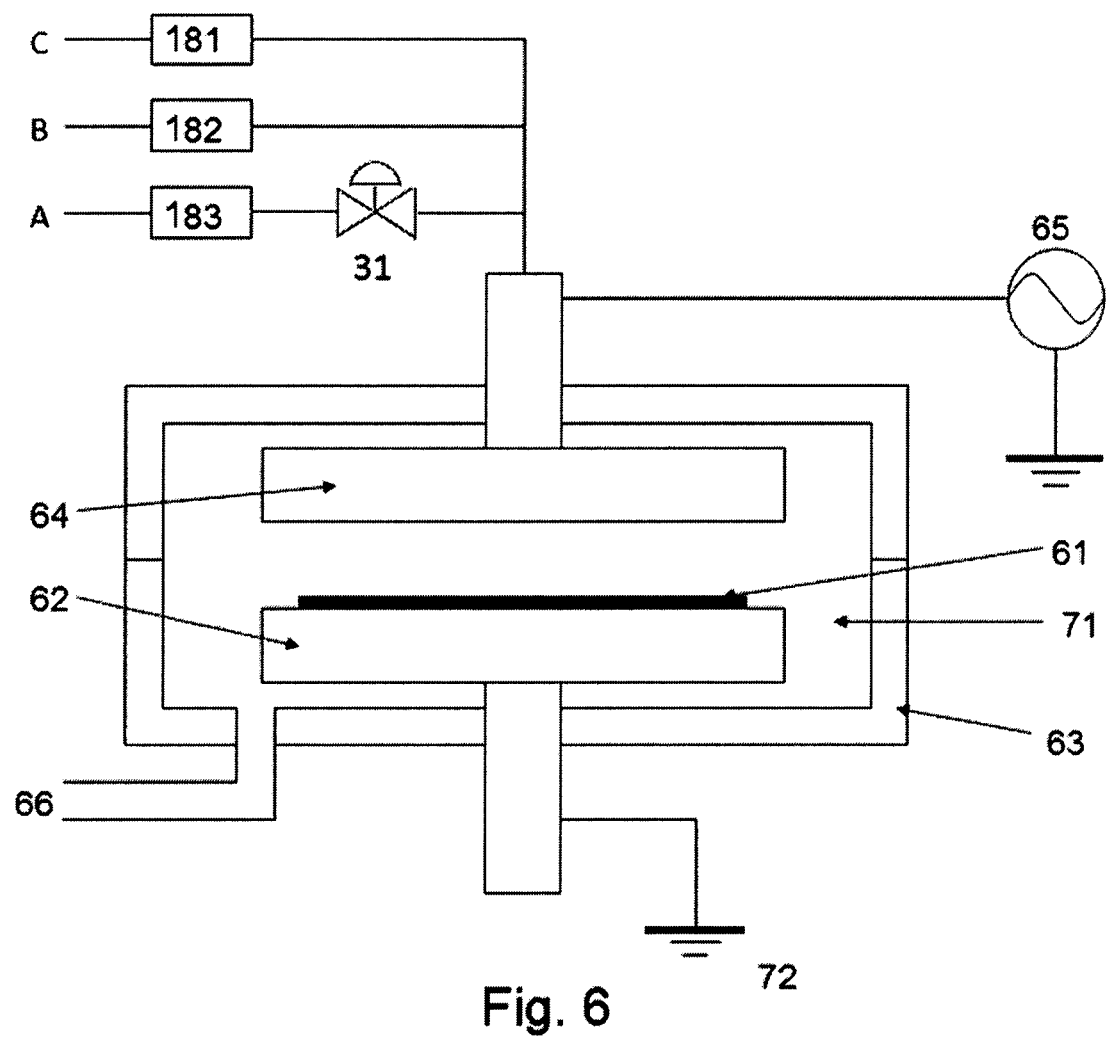
FIG. 6 is a schematic representation of a PE-ALD apparatus for depositing a spacer film usable in one embodiment of the present invention.

FIG. 6 is a schematic representation of an apparatus usable in some embodiments. In this example, by providing a pair of electrically conductive flat-plate electrodes 64, 62 in parallel and facing each other in the interior 71 of a reaction chamber 63, applying RF power 65 to one side, and electrically grounding 72 the other side, a plasma is excited between the electrodes. A temperature regulator is provided in a lower stage (which also serves as the lower electrode 62), and a temperature of a substrate 61 placed thereon is kept constant at a given temperature. The upper electrode 64 serves as a shower plate as well, and the reactant gas (C) and additive/ purge gas (B), if any, are introduced into the reaction chamber 63 through gas flow controllers 181, 182, respectively, and the shower plate. Also the precursor (A) is introduced into the reaction chamber 63 through a gas flow controller 183, a pulse flow control valve 31, and the shower plate. Additionally, in the reaction chamber 63, an exhaust pipe 66 is provided through which gas in the interior 71 of the reaction chamber 63 is exhausted. Additionally, the reaction chamber is provided with a seal gas flow controller (now shown) to introduce seal gas into the interior 71 of the reaction chamber 63. A separation plate for separating a reaction zone and a transfer zone in the interior of the reaction chamber is omitted from this schematic figure. The seal gas is not required but is used in some embodiments for aiding in preventing reaction gas from communicating with the lower part of the chamber below the separation plate.

For the pulse flow control valve 31, a pulse supply valve can effectively be used for PE-ALD. This apparatus can also be used for PE-CVD. The pulse control valve can be provided for the reactant gas (C) and/or the additive/purge gas (B). Further, RF power can be pulsed. In the above, the pulsing of the RF power can be accomplished by adjusting a matching box (not shown). The RF power requires a minimum time period for discharging, which is typically as short as 8 msec. Thus, by adjusting the matching box, the duration of the RF power can easily be controlled at about 0.1 sec, for example.

In some embodiments, the average thickness deposited per cycle may be about 0.6 nm/cycle to about 1.0 nm/cycle. The pulse supply of the precursor can be continued until a desired thickness of film is obtained. If the desired thickness of film is about 20 nm to about 100 nm, about 20 cycles to about 150 cycles (e.g., about 40 to about 100 cycles) may be conducted.

A remote plasma unit can be connected to the apparatus, through which an etching gas or a process gas can be supplied to the interior of the apparatus through the showerhead 64.

Figure 8:
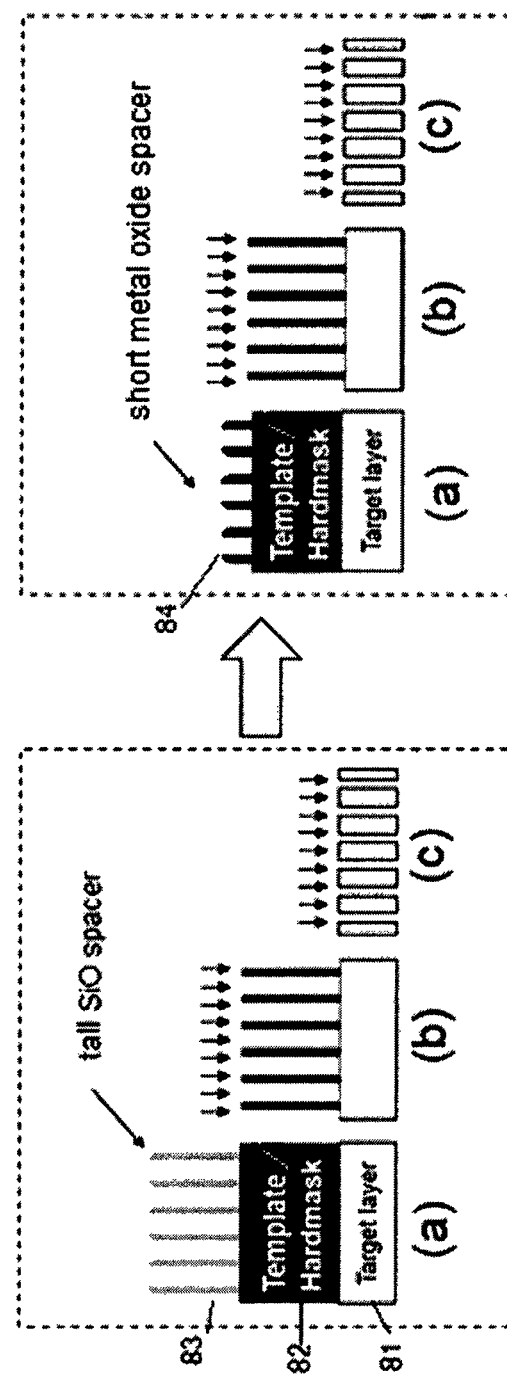
FIG. 8A is a schematic representation of pattern transfer and target etching according to a comparative example.
FIG. 8B is a schematic representation of pattern transfer and target etching according to an embodiment of the present invention.

As described above in relation to FIG. 1(d), the causes of pattern collapsing are expected to be: 1) the template height is too high to maintain a spacer during subsequent dry etching, 2) the mechanical properties of a spacer film are poor, e.g., its elastic modulus and hardness are so low as to cause deformation easily, and 3) the difference in film stress between the spacer film and the core material is so great as to result in pattern collapsing. In some embodiments, the above causes of pattern collapsing can be eliminated by using a spacer comprising, represented by, made predominately of, consisting essentially of, constituted by, or equivalent to any of the metal oxides explicitly, necessarily, or inherently disclosed herein. For example, as shown in FIG. 8B, since a metal oxide such as $TiO_2$ as a hardmask has high etch selectivity against an underlying template/hardmask 82, the height of the hardmask constituted by $TiO_2$ can be significantly low as compared to that of a hardmask constituted by SiO (FIG. 8A). In FIG. 8A, since the etch selectivity of the SiO spacer 83 as a template (the $SiO_2$ spacer is not considered to be a hardmask due to its low dry etch resistivity) is not high, the height of the template needs to be great, resulting in a tall vertical spacer in step (a) which corresponds to step (d) in FIG. 4 (steps (b) to (d) in FIG. 4 are referred to as "spacer defined double patterning"). When etching the template/hardmask 82 using the spacer 83 in step (b) to transfer a patter to the template/hardmask 82, the vertical spacer 83 tends to be at least partially collapsed or deformed. If the vertical spacer is deformed or collapsed, the pattern transfer is not performed accurately, resulting in inaccurate etching of a target layer 81 in step (c). In FIG. 8B, since the metal oxide spacer has high etch selectivity, an etched template for forming the spacer thereon (see, e.g., a template/ hardmask 91 in step (b) of FIG. 9) can be short and thus can be sustained during etching to form a vertical spacer 84 (metal oxide spacer) in step (a). Thus, steps (b) and (c) can be performed accurately. In some embodiments, preferably, the height of the vertical spacer (i.e., the thickness of a template to be patterned by etching) may be in a range of about 50 nm to about 400 nm, typically about 80 nm to about 200 nm, and the thickness of the vertical spacer may be in a range of about 3 nm to about 60 nm, typically about 5 nm to about 40 nm. Further, the metal oxide spacer has high elastic modulus and hardness (as measured as a film) (preferably an elastic modulus of about 70 GPa to about 400 GPa, typically about 100 GPa to about 200 GPa, and a hardness of about 5 GPa to about 20 GPa, typically about 6 GPa to about 15 GPa), and thus, the spacer can be sustained during dry etching.

Figure 9:
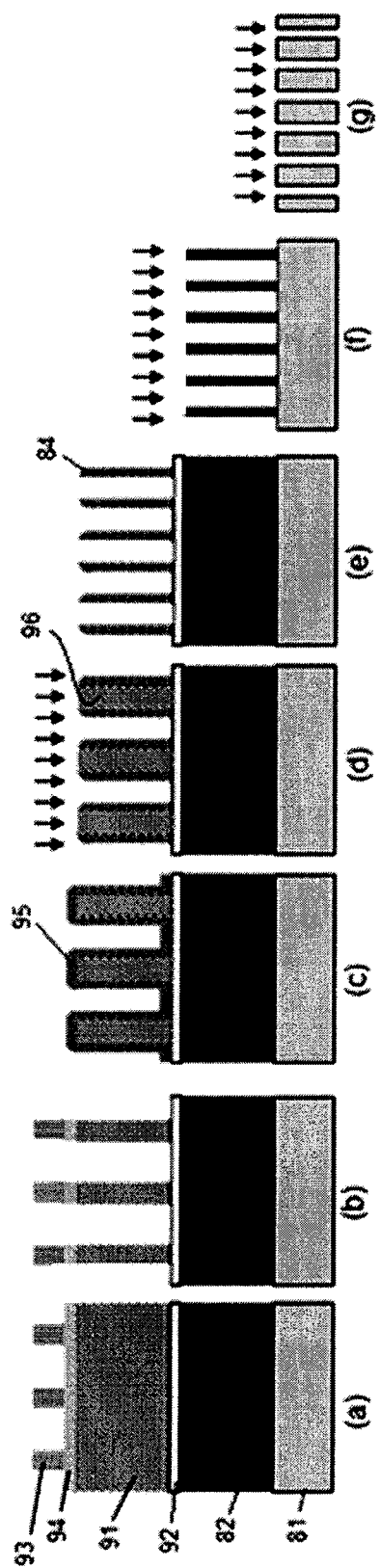
FIG. 9 is a schematic representation of pattern transfer and target etching using space defined double patterning (SDDP) according to an embodiment of the present invention.

Additionally, the film stress of the metal oxide (as measured as a film) can be controlled by changing the duration of RF application and/or RF power, and the film stress can be changed from tensile to compressive and can minimize pattern deformation, so that the difference in film stress between the spacer film (which constitutes vertical spacers) and the core material (which is a photoresist material of a template remaining in spaces surrounded by the vertical spacers in step (d) in FIG. 9) can be minimized, thereby inhibiting pattern collapsing. In some embodiments, the film stress of the spacer film as measured as a planar film and the film stress of the core material as measured as a planar film may be substantially or nearly the same, or equivalent, or less than about 100 MPa, or less than about 50 MPa. The film stresses are equivalent if the differences therebetween are so small as to inhibit pattern collapsing in SDDP, for example. In some embodiments, the film stress of the template is first determined, and then, a desired film stress of the spacer is determined, and accordingly, deposition conditions for the spacer are determined to adjust the film stress of the spacer to the desired value as a function of RF power and/or the duration of RF power.

In this disclosure, the term "template" refers to a film to be processed such as a film subjected to patterning or formation of holes, and the term "hardmask" refers to a film having high etch resistivity, e.g., about five times higher than a template to be etched, so that the film can effectively protect a certain portion of the template from being etched. The "hardmask" may be referred to as an "etch mask".

In some embodiments, the use of nitrogen-containing gas such as $NH_3$ and $N_2$ as a reactant gas increases a film growth rate in PEALD for a metal oxide such as $TiO_2$. Further, the use of nitrogen-containing gas can significantly increase wet etch rate (preferably 2 to 20 times, typically 4 to 8 times, higher than the standard thermal oxide), but can effectively maintain dry etch resistance (as dry etch rate, preferably about 1/100 to about 1/5, typically about 1/50 to about 1/10, of that of the standard thermal oxide), which are highly beneficial to subsequent spacer removal. In some embodiments, nitrogen-containing gas is used in a flow rate of about 100 sccm to about 2,000 sccm, typically about 200 sccm to about 1,000 sccm, typically in combination with oxygen gas (preferably about 200 sccm to about 1,000 sccm). In some embodiments, the flow rate of nitrogen-containing gas is less than 50% of total reactant gas but more than 10% (typically 20% to 35%).

As discussed above, according to some embodiments, at least one of the following benefits can be realized: By adding low-frequency RF (LRF) (such as about 200 MHz to about 1,000 MHz, typically about 300 MHz to about 600 MHz) at a power ratio of LRF to total RF of about 1 to about 30, film stress can be more effectively controlled. By controlling plasma ignition conditions (e.g., power and/or ignition time per cycle), film stress and wet etch rate can effectively be controlled. By using nitrogen-containing reactant gas, film properties can effectively be tuned or adjusted.

FIG. 9 is a schematic representation of pattern transfer and target etching using space defined double patterning (SDDP) according to another embodiment of the present invention, wherein the metal oxide film is used as a hardmask between templates to transfer a pattern from the first template to the second template. A template/hardmask 91 is used for increasing pattern density (e.g., pitch reduction) in SDDP processes. A template/hardmask 82 is used as a hardmask for etching a target layer 81. A hardmask 92 is used for transferring a pattern from the template/hardmask 91 to the template/hardmask 82. In step (a) in FIG. 9, on a bottom antireflective coating (BARC) 94, a photoresist pattern 93 is formed so that the template/hardmask 91 can be etched in the photoresist pattern in step (b) which is a step of transferring a pattern to the template/hardmask 91. In step (c), a metal oxide spacer 95 is deposited according to any of the disclosed embodiments or equivalents thereto, followed by etching in step (d) which is a spacer RIE step. By stripping the material of the template/hardmask 91 (a photoresist material in the core portions 96), vertical spacers are formed in step (e). Steps (e) to (g) in FIG. 9 correspond to steps (a) to (c) in FIG. 8B (although the height of the vertical spacer is exaggerated). That is, in step (f), the pattern is transferred to the template/hardmask 82, and in step (g), the target layer 81 is subjected to dry etch. In the above, by using a metal oxide according to any of the disclosed embodiments or equivalents thereto as the hardmask 92, the pattern can effectively be transferred from the template/hardmask 91 to the template/hardmask 82. In some embodiments, a planar hardmask such as the hardmask 92 may be deposited by any of the methods disclosed herein or equivalents thereof or by pulsed PECVD.

The embodiments will be explained with reference to specific examples which are not intended to limit the present invention. The numerical numbers applied in the specific examples may be modified by a range of at least ±50% in other conditions, wherein the endpoints of the ranges may be included or excluded.

EXAMPLE

Example 1

Figure 7:
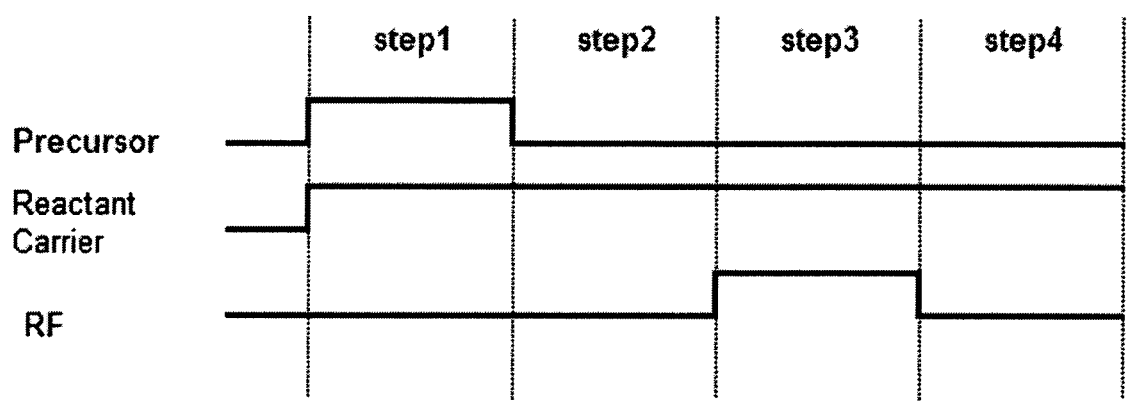
FIG. 7 illustrates a process sequence of one cycle of PE-ALD according to an embodiment of the present invention.

A metal oxide hardmask film was formed on a substrate (Φ200 mm) by PE-ALD under the conditions shown below using the PE-ALD apparatus illustrated in FIG. 6. The sequence in each cycle of PE-ALD is shown in FIG. 7.

TABLE 1

| Precursor | Titanium tetra-isopropoxide |
|---|---|
| Deposition temperature | 50 deg C. |
| Reactant gas flow | $O_2$, 500 sccm |
| Carrier gas flow | Ar, 2000 sccm |
| Deposition pressure | 200 Pa |
| RF power (27.12 MHz) | 50 W |

| Step 1: Precursor feed | Step 2: Precursor purge | Step 3: RF ignition | Step 4: Post purge |
|---|---|---|---|
| 0.9 sec | 2.0 sec | 0.5 sec | 0.5 sec |

A SiO hardmask (LT-SiO) was also formed on a substrate by PE-ALD under conditions substantially the same as above.

Dry etch selectivity and wet etch selectivity of each hardmask (also those of standard thermal oxide) were measured, and the results are shown below.

TABLE 2

| | Thermal oxide | PEALD LT-SiO | PEALD $TiO_2$ |
|---|---|---|---|
| Dry etch rate ($NF_3$, 100 deg C.) | 0.20 | 1.00 | 0.11 |
| Wet etch rate (DHF 1:100) | 0.09 | 1.00 | 0.10 |

Hardness and Elastic modulus of each hardmask were also measured, and the results are shown below.

TABLE 3

| | PEALD LT-SiO | PEALD $TiO_2$ |
|---|---|---|
| EM (GPa) | 41.6 | 158.7 |
| Hardness (GPa) | 3.6 | 9.8 |

As shown in the above tables, the TiO hardmask has substantially high dry/wet etch selectivity relative to that of the LT-SiO hardmask. The wet etch selectivity of the TiO hardmask was substantially comparable to that of the standard thermal oxide, and the dry etch rate of the TiO hardmask was substantially lower than that of the LT-SiO hardmask. Further, the mechanical strength of the TiO hardmask was substantially higher than that of the LT-SiO hardmask, indicating that the spacer-collapsing problem can effectively be avoided.

Example 2

In the same manner as described in Example 1 except for the conditions shown in Table 4 below, films were deposited to compare film growth rates using titanium tetraisopropoxide (TTIP) and tetrakis-dimethylaminotitanium (TDMAT). As can be seen from the table, the film growth rate by TDMAT was nearly two times higher (2-3, 2-4) than that by TTIP (2-1, 2-2). The properties of the obtained film by TDMAT were comparable with those by TTIP, although the wet etch rate of the film by TDMAT was increased by about two to three times that by TTIP. Additionally, by prolonging the RF ignition time (2-5), the mechanical strength was increased and the wet etch rate was reduced.

TABLE 4

| | 2-1 | 2-2 | 2-3 | 2-4 | 2-5 |
|---|---|---|---|---|---|
| Precursor | TTIP | TTIP | TDMAT | TDMAT | TDMAT |
| RF power | 50 W | 100 W | 50 W | 100 W | 100 W |

TABLE 4-continued

|  |  | 2-1 | 2-2 | 2-3 | 2-4 | 2-5 |
|---|---|---|---|---|---|---|
| RF ignition time per cycle |  | 0.4 sec | 0.4 sec | 0.4 sec | 0.4 sec | 2.0 sec |
| GPC | (nm/cycle) | 0.042 | 0.042 | 0.079 | 0.074 | 0.059 |
| RI |  | 2.401 | 2.407 | 2.281 | 2.308 | 2.415 |
| WER (1:100 DHF) | Ratio compared to thermal oxide | 0.75 | 0.84 | 2.79 | 1.47 | 0.64 |
| Hardness | (GPa) | 9.01 | 9.39 | 8.10 | 8.90 | 12.70 |
| EM | (GPa) | 160.6 | 167.5 | 130.2 | 147.0 | 190.1 |
| Film stress | (MPa, Tensile=+) | 388.8 | 370.6 | 226.6 | 227.8 | 181.8 |

GPC: Growth rate per cycle;
RI: Refractive index;
WER: Wet etch rate;
DHF: Dilute hydrofluoric acid;
EM: Elastic modulus Example 3

In the same manner as described in Example 1 except for the conditions shown in Tables 5 and 6 below, films were deposited to confirm controllability of film stress. As can be seen from Table 6, the film stress was well controlled by changing plasma-on time (duration of RF ignition) and/or plasma power (RF power), indicating that the films obtained using TTIP are suitable as a spacer having pattern-collapsing resistance. That is, by increasing the plasma-on time, the degree of tensile stress of the film can be reduced, and by increasing plasma power, the degree of tensile stress of the film can be reduced and can even be changed to compressive stress.

TABLE 5

| TiO$_2$ | | | | | |
|---|---|---|---|---|---|
| Source | TTIP | 23 sccm | | | |
| Reactant gas | Oxygen | 500 sccm | | | |
| Carrier gas | Ar | 2000 sccm | | | |
| Pressure | 200 Pa | RF power | | Variable (X) W | |
| Source feed | Purge 1 | Plasma on | | Purge 2 | |
| 0.3 sec | 0.6 sec | Variable (Y) sec | | 0.1 sec | |

TABLE 6

| Process temperature | Precursor supply | Plasma power (X) | Plasma-on time (Y) | Film stress |
|---|---|---|---|---|
| 100 deg C. | TTIP | 50 W | 0.4 sec | +388 MPa |
| 100 deg C. | TTIP | 50 W | 2.0 sec | +161 MPa |
| 100 deg C. | TTIP | 100 W | 0.4 sec | +275 MPa |
| 100 deg C. | TTIP | 300 W | 0.4 sec | −268 MPa |

Example 4

In the same manner as described in Example 1 except for the conditions shown in Table 7 below, films were deposited to evaluate effects of NH$_3$ on properties of the films.

As can be seen from Table 5 below, when adding NH$_3$ to oxygen as a reactant (4-3, 4-4), the film growth rate was increased (by over 20%), and the dry etch rate of the film was significantly decreased (by over 70%), whereas the wet etch rate of the film was surprisingly increased (by over 600%) as compared with that without NH$_3$ (4-1, 4-2), indicating that the film is suitable as a spacer which has chemical resistance but is easily removable. Additionally, the properties of the films obtained using less NH$_3$ (4-3) and more NH$_3$ (4-4) than oxygen appear to be similar.

TABLE 7

| | | Precursor: TTIP | | | |
|---|---|---|---|---|---|
| | | 4-1 | 4-2 | 4-3 | 4-4 |
| | | Process condition | | | |
| | | O$_2$ 500 sccm NH$_3$ 0 sccm | O$_2$ 1000 sccm NH$_3$ 0 sccm | O$_2$ 500 sccm NH$_3$ 250 sccm | O$_2$ 500 sccm NH$_3$ 1000 sccm |
| GPC | (nm/cycle) | 0.042 | 0.042 | 0.055 | 0.052 |
| RI | | 2.401 | 2.407 | 2.179 | 2.177 |
| WER (1:100 DHF) | Ratio compared to thermal oxide | 0.75 | 0.84 | 6.38 | 5.45 |
| DER (100° C. NF$_3$) | Ratio compared to thermal oxide | 0.24 | 0.27 | 0.07 | 0.06 |
| Hardness | (GPa) | 9.01 | 9.39 | 6.79 | 6.82 |
| EM | (GPa) | 160.6 | 167.5 | 114.5 | 113.7 |
| Film stress | (MPa, Tensile = +) | 388.8 | 370.6 | 312.4 | 303.3 |

Example 5

Figure 5:
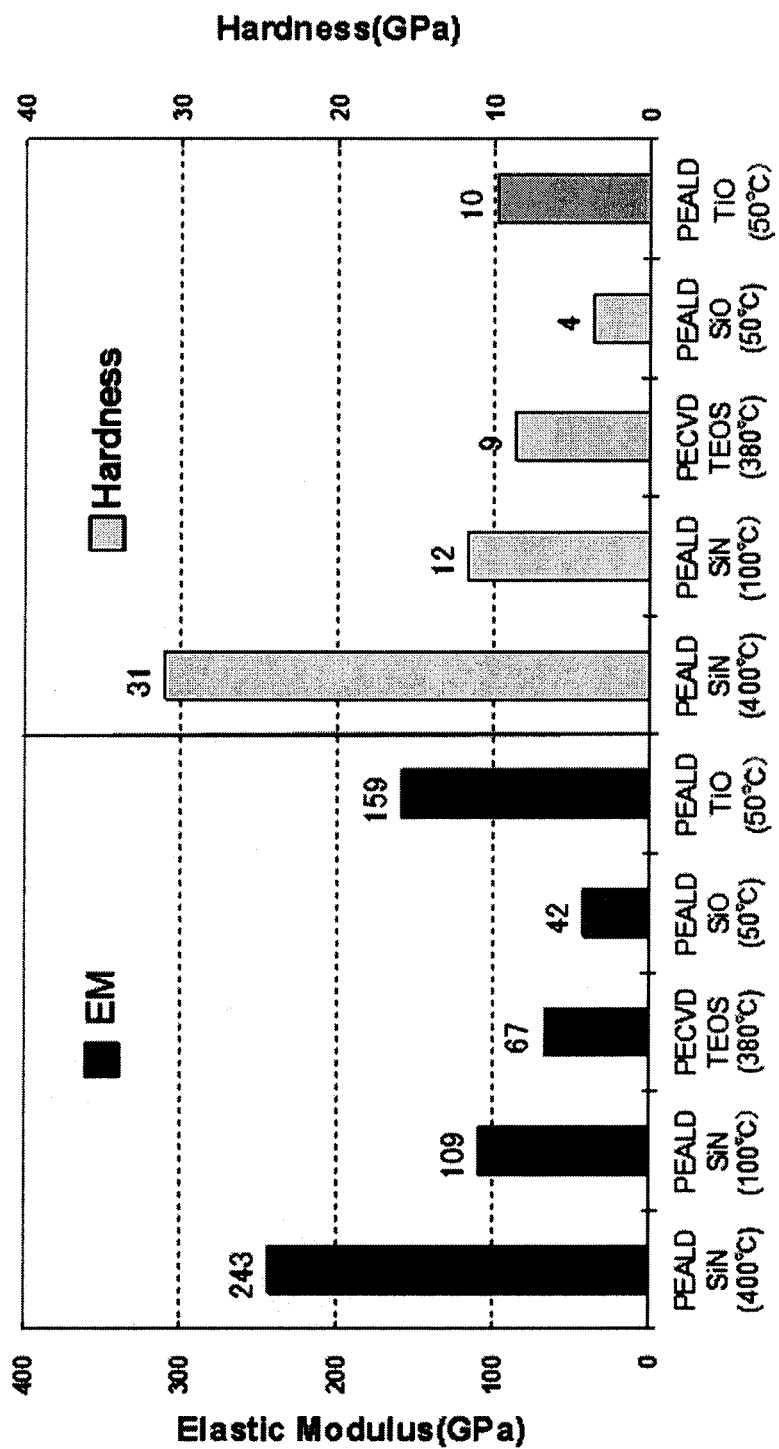
FIG. 5 illustrates elastic modulus and hardness of each spacer film deposited in the examples.

In addition to Example 1, SiN hardmasks were formed by PE-ALD at 400° C. and at 100° C., respectively, and a TEOS hardmask was also formed by PE-ALD at 380° C., according to conventional recipes, and the mechanical strength of the resultant hardmasks was measured. The results are shown in FIG. 5. As can be seen from FIG. 5, the TiO hardmask has a substantially higher elastic modulus than that of the SiN hardmask at 100° C. and the TEOS hardmask, and the hardness of the TiO hardmask is comparable to that of the SiN hardmask at 100° C. and the TEOS hardmask. Since the TiO hardmask has a significantly high elastic modulus, the spacer collapse problem can effectively be avoided (elastic modulus is more important than hardness in terms of prevention of spacer collapse). Additionally, the TiO hardmask has significant advantages as compared with the SiN hardmask at 100° C. and the TEOS hardmask in terms of deposition rate, conformality, etch selectivity, etc. For example, the SiN hardmask at 100° C. has a good etch selectivity relative to a base film, but it is not easy to remove by etching. The TEOS hardmask does not have a good etch selectivity relative to a base film. The SiN hardmask at 400° C. has higher mechanical strength than the TiO hardmask. However, the deposition temperature of 400° C. causes thermal damage to a template or photoresist, and further, copper or other metal diffusion or migration is likely to be a problem. Further, removing the SiN hardmask at 400° C. is not easy, and even at 400° C., the deposition rate is low. In view of the above, the TiO hardmask is significantly superior to the other hardmasks.

Example 6

In the same manner as in Example 5 except for the conditions shown in Table 8 below, films were deposited to evaluate elastic modulus and hardness of the films. As can be seen from the table, a film of $TiO_2$ shows excellent elastic modulus even though the deposition temperature was low, and also the film shows as good hardness as a SiN film and significantly better hardness than a SiO film.

TABLE 8

| Material | | | Elastic Modulus | Hardness |
|---|---|---|---|---|
| $TiO_2$ | PEALD | 100 deg C. | 175 GPa | 10.3 GPa |
| SiO | PECVD | 380 deg C. | 80 GPa | 10.3 GPa |
|  | PEALD | 75 deg C. | 45.3 GPa | 4.3 GPa |
|  | ALD | 450 deg C. | 56.4 GPa | 5.1 GPa |
| SiN | PEALD | 100 deg C. | 108 GPa | 11.7 GPa |
|  | PEALD | 400 deg C. | 243 GPa | 31 GPa |

Example 7

In the same manner as in Example 1 except for the conditions shown in Table 9 below, films were deposited to evaluate refractive index (at 633 nm) and average growth rate (nm/cycle) of the films, wherein an ALD cycle ratio of the number of cycles for $TiO_2$ to the total number of cycles for $TiO_2$ and $SiO_2$ per unit cycle for one layer of multi-element film was changed from 0/1 to 1/1 (i.e., 0/1, 1/3, 1/2, 2/3, and 1/1). In the above, a ratio of 1/3 refers to a unit cycle constituted by two $SiO_2$ cycles, followed by one $TiO_2$ cycle; a ratio of 1/1 refers to a unit cycle constituted by one $SiO_2$ cycle, followed by one $TiO_2$ cycle; and a ratio of 2/3 refers to a unit cycle constituted by one $SiO_2$ cycle, followed by two $TiO_2$ cycles, wherein each unit cycle was repeated at desired times.

TABLE 9

| $SiO_2$ cycle | | | |
|---|---|---|---|
| Source | BDEAS | 26 sccm | |
| Reactant gas | Oxygen | 500 sccm | |
| Carrier gas | Ar | 2000 sccm | |
| Pressure | 200 Pa | RF power | 100 W |
| Source feed | Purge 1 | Plasma on | Purge 2 |
| 0.3 sec | 0.6 sec | 0.4 sec | 0.1 sec |
| $TiO_2$ cycle | | | |
| Source | TTIP | 23 sccm | |
| Reactant gas | Oxygen | 500 sccm | |
| Carrier gas | Ar | 2000 sccm | |
| Pressure | 200 Pa | RF power | 100 W |
| Source feed | Purge 1 | Plasma on | Purge 2 |
| 0.3 sec | 0.6 sec | 0.4 sec | 0.1 sec |

Figure 10:
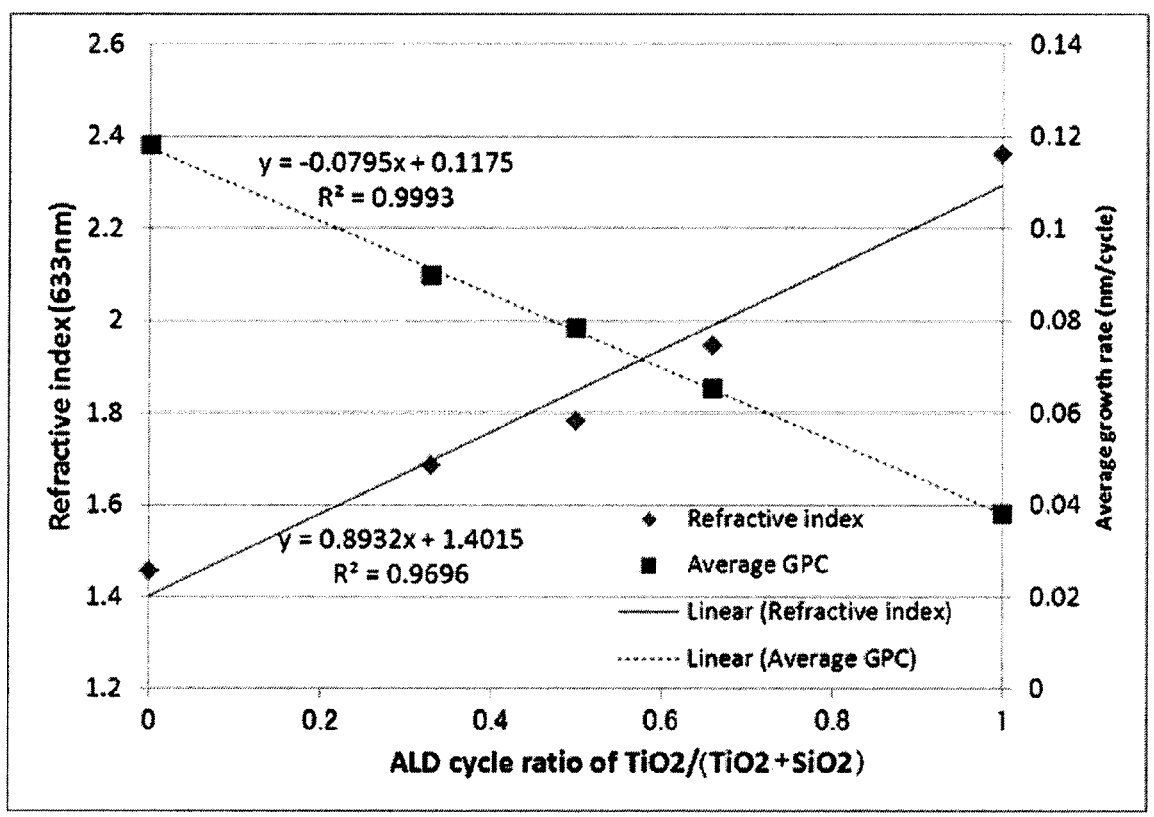
FIG. 10 is a graph illustrating the relationship between refractive index (at 633 nm) and average growth rate (nm/cycle) in relation to the ALD cycle ratio of $TiO_2/(TiO_2+SiO_2)$ according to embodiments of the present invention.

As shown in FIG. 10, it was confirmed that by changing the ALD cycle ratio (e.g., in any ranges defined by any two values of the above ratios or any two numbers of 0.1 to 0.9 in 0.1 increments), the refractive index and the growth rate of the resultant films could be adjusted at desired levels, although the relationship between the refractive index and the ALD cycle ratio and the relationship between the growth rate and the ALD cycle ratio were reversed.

The present invention can include, but is not limited to, the following additional embodiments and advantages:

In order to avoid spacer collapse, mechanically robust materials other than those disclosed above can be used.

Figure 3:
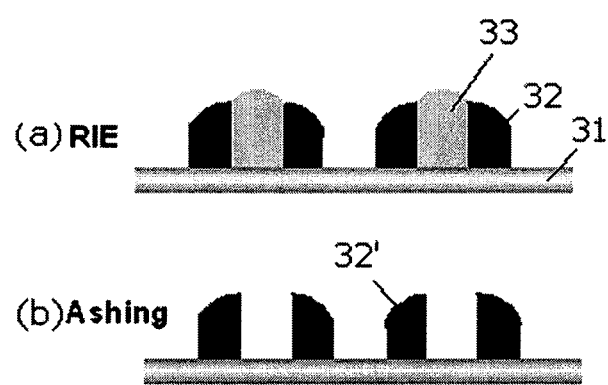
FIG. 3 is a schematic representation illustrating in-situ footing reduction where (a) reactive ion etch (RIE) and (b) ashing are conducted.

In order to avoid spacer collapse, footing reduction can be performed. FIG. 3 is a schematic representation illustrating in-situ footing reduction where (a) reactive ion etch (RIE) and (b) ashing are conducted. In step (a), a spacer film is deposited by PE-ALD on a photoresist and a base film, and in-situ interface control is conducted, thereby performing in-situ footing reduction of the spacer film, wherein a top surface of a photoresist 33 and a part of a base film 31 are exposed, and a spacer 32 does not have extended footing. In step (b), by ashing, the photoresist 33 is removed, thereby forming the spacer 32' having reduced footing, decreasing CD changes. The metal oxide hardmask selected in some embodiments of the present invention is effective for footing reduction.

In order to avoid spacer collapse, adhesion between the spacer and the base film can be enhanced. Enhancing adhesion can be accomplished by forming an adhesion layer or treating a surface of the base film. The metal oxide hardmask selected in some embodiments of the present invention is effective for enhancing adhesion.

All processes can be done sequentially in one PE-ALD reactor, including pre-bake, trimming, adhesion control, deposition and surface control, thereby achieving high productivity and low cost.

Dry etch rate and mechanical strength can be controlled by combining multiple materials.

In-situ reactor self cleaning can be performed by selecting a metal whose fluoride has high vapor pressure at room temperature (unlike $AlF_3$), thereby achieving high productivity and low cost. The metal oxide hardmask selected in some embodiments of the present invention is effective for easy self cleaning.

The deposition process is ALD so that 100% conformality, less pattern loading, and good uniformity can effectively be achieved.

Since ALD dielectric materials have been widely studied, it is possible to select good candidate materials without undue burden by using at least one or all of the criteria disclosed in the embodiments.

Generally, thermal ALD is very challenging at low temperatures such as less than 400° C. because chemical reactivity decreases with temperature. PE-ALD is advantageous at low temperatures, and a conformal film can be formed. Unlike thermal ALD, PE-ALD can deposit different materials on a substrate at the same temperature. Also for this reason, PE-ALD is advantageous. Thermal reaction cannot effectively control film composition and precursor adsorption. PE-ALD can control each film quality by tuning process conditions. Good process controllability and good process reliability can be realized by using PE-ALD. Incidentally, a catalyst used as an aid of deposition is usually not useful in either thermal or PE-ALD, and thus, no catalyst is used.

A preferred metal oxide is expressed by $Si_xTi_{(1-x)}O_y$, wherein $0 \leq x < 1$, $y \sim 2$. A WO or TaO hardmask can be used. Additionally, a TiN, WN, or TaN hardmask may be used in combination with those disclosed herein.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. A method of forming a metal oxide hardmask on a template, comprising:
   providing a template constituted by a photoresist or amorphous carbon formed on a substrate;
   depositing by atomic layer deposition (ALD) a metal oxide hardmask on the template constituted by a material having a formula $Si_xM_{(1-x)}O_y$ wherein M represents at least one metal element, x is less than one including zero, and y is approximately two or a stoichiometrically-determined number, wherein M is a metal whose fluoride has a vapor pressure of more than 100 Pa at a temperature for cleaning a reactor used for depositing the metal oxide hard mask; and wherein the ALD is plasma enhanced ALD(PE-ALD), wherein the depositing of the metal oxide hardmask comprises supplying a precursor for the metal oxide hardmask in pulses and applying RF power in pulses between the pulses of the precursor, wherein at least one reactant gas is supplied while applying the RF power, wherein the precursor is a metal-containing alkylamino compound or metal-containing alkoxy compound.

2. The method according to claim 1, wherein the metal oxide hardmask is a spacer film.

3. The method according to claim 2, wherein the spacer film is for spacer-defined double patterning (SDDP), and the method further comprises performing SDDP after the step of depositing the spacer film on the template.

4. The method according to claim 1, wherein M is Ti, W, or Ta.

5. The method according to claim 4, wherein M is Ti.

6. The method according to claim 5, wherein the material constituting the metal oxide hardmask is $TiO_2$.

7. The method according to claim 1, wherein the ALD is performed at a temperature of 300° C. or lower for the template constituted by the amorphous carbon or at a temperature of 150° C. or lower for the template constituted b the photoresist.

8. The method according to claim 1, wherein the ALD is performed under conditions substantially equivalent to those set for a $SiO_2$ hardmask constituted by $SiO_2$, wherein a gas containing M is used in place of a gas containing Si for the $SiO_2$ hardmask.

9. The method according to claim 8, wherein the metal oxide hardmask has an elastic modulus at least three times higher than that of the $SiO_2$ hardmask, and a hardness at least two times higher than that of the $SiO_2$ hardmask.

10. The method according to claim 8, wherein the metal oxide hardmask has a dry etch rate lower than that of the $SiO_2$ hardmask and a wet etch rate comparable to that of standard thermal oxide.

11. The method according to claim 1, wherein the substrate has a base film formed under the template, which base film is constituted by silicon oxide.

12. The method according to claim 1, wherein the template has a convex pattern constituted by the photoresist or amorphous carbon, said convex pattern having a width of less than one micron meter and a ratio of height to width of one or higher.

13. The method according to claim 1, wherein the reactant gas comprises a nitrogen-containing gas.

14. The method according to claim 1, wherein the metal oxide hardmask is constituted by a laminate of atomic layers of a metal oxide and atomic layers of a silicon oxide alternately deposited.

15. The method according to claim 1, wherein the metal oxide hardmask has a film stress equivalent to that of the template.

* * * * *